United States Patent [19]
Balistreri et al.

[11] Patent Number: 5,321,665
[45] Date of Patent: Jun. 14, 1994

[54] DUAL-PORT MEMORY HAVING A SERIAL REGISTER ACCESSING ARRANGEMENT WITH PULSED DECODING

[75] Inventors: Anthony M. Balistreri, Houston; Andre J. Guillemaud, Sugarland, both of Tex.

[73] Assignee: Texas Instruments Incorporated, Dallas, Tex.

[21] Appl. No.: 905,690

[22] Filed: Jun. 29, 1992

[51] Int. Cl.$^5$ .............................................. G11C 13/00
[52] U.S. Cl. ......................... 365/230.05; 365/189.12; 365/221; 365/230.06; 365/240
[58] Field of Search ...................... 365/230.05, 230.06, 365/240, 221, 189.12; 395/400

[56] References Cited

U.S. PATENT DOCUMENTS

| | | | |
|---|---|---|---|
| 5,018,110 | 5/1991 | Sugiyama et al. | 365/240 X |
| 5,042,014 | 8/1991 | Pinkham et al. | 365/230.09 X |
| 5,117,388 | 5/1992 | Nakano et al. | 365/221 X |

Primary Examiner—Eugene R. LaRoche
Assistant Examiner—Do Hyun Yoo
Attorney, Agent, or Firm—Richard B. Havill; Richard L. Donaldson

[57] ABSTRACT

A data processing system includes a video random access memory with a serial register having a serial register tap addressing arrangement wherein tap addresses are decoded from column address factors and are applied to data gates associated stages of the serial register accessing data from the serial register stages. A decoder responds to a code word and generates a stages select signal that controls the data gates between the serial register stages and data lines. A plurality of code word gates, interposed in the decoder inputs and responsive to a control pulse, enable the stages select signal only while the control pulse is active. By thus limiting the decoder input to pulsed code words, sequential bit interference and inadvertent bit overwriting are avoided. An equalizer circuit, connected with each data line, equalizes the potential on the data lines before the accessed data bit is applied to the selected data line.

7 Claims, 9 Drawing Sheets

DUAL-PORT MEMORY HAVING A SERIAL REGISTER ACCESSING ARRANGEMENT WITH PULSED DECODING

CROSS-REFERENCE TO RELATED APPLICATIONS

The following coassigned patent applications are hereby incorporated herein by reference:

| Serial No. | Filing Date |
|---|---|
| 563,469 | 08-06-90 |
| 821,641 | 01-23-86 |
| 773,068 | 10-08-91 |

FIELD OF THE INVENTION

This invention relates to a video random access memory (VRAM) and more particularly to a VRAM having a serial register for reading data serially out of the VRAM.

BACKGROUND OF THE INVENTION

Data processing systems often are arranged with a graphics display which provides an optical display of output information for the user. A video random access memory is a basic part of the graphics display arrangement.

In the prior art, the video random access memory includes a serial register to which a row of data from the random access memory array is transferred in preparation for a serial readout operation. The serial register has a number of stages equal in number to the columns in the video random access memory. Each serial register stage includes a tap that can be addressed by the same binary address that is used for addressing the associated column in the video random access memory array.

Address decoding for the video random access memory array columns and the taps of the serial register have been accomplished separately in prior art arrangements. The video random access array columns are selected by decoding an applied binary address into a one out-of-X code, where X equals the number of columns in the array. The desired one column is selected by the active signal in the one-out-of-X code. Serial register taps are selected by decoding an applied initial tap binary address into a code that is applied to a binary counter. When a serial sequence is to be read out of the serial register, the initial tap address and subsequent addresses in the binary counter are incremented for producing a series of successive addresses for the serial register taps. The sequence of binary addresses is decoded into a one-out-of-X code which selects the desired sequence of the serial register taps. Each desired tap is selected by the active signal in the one out of X code.

There are four data lines selected for access at one time. A stages select signal enables data gates between the selected serial register stages and their associated data lines. The enabled data gates allow the data bit stored in each selected serial register stage onto the associated data line. This does not complete the access of the data because a single one of those data bits then is further gated to the output circuitry. The other three data bits may not be gated to the output in sequence following the first data bit.

Since each of the four data lines has a data bit applied when the data gates are enabled, the resulting signals can remain on the data lines when the stages select signal makes a new selection of serial register stages. The newly selected stages also are enabled to apply their stored data bits onto the data lines. Since the data lines are lengthy and have a large number of serial register stages gated to them, there is a large capacitance connected to each data line.

Such capacitance delays decay of the signal representing the first signal on each data line and retards ramp up of the second signal on each data line. Errors can occur in the detection of the data bits if the access operation is run too fast. Also under some circumstances, the data bit residing on the data line when another serial register stage is enabled may overwrite the existing data bit in that serial register stage.

SUMMARY OF THE INVENTION

These and other problems are solved for a data processing system including a video random access memory with a serial register having a serial register tap addressing arrangement wherein a decoder, responsive to a code word, generates the stages select signal for enabling data gates between serial register stages and data lines. A plurality of code word gates, interposed in the decoder inputs and responsive to a control pulse, enable the stages select signal only while the control pulse is active.

An equalizer circuit, connected with each data line equalizes the potential on the data lines before the accessed data bit is applied to the selected data line.

BRIEF DESCRIPTION OF THE DRAWINGS

The arrangement and operation of an embodiment of the invention may be better understood by reading the subsequent detailed description while making reference to the drawing wherein.

DETAILED DESCRIPTION

Figure 1:
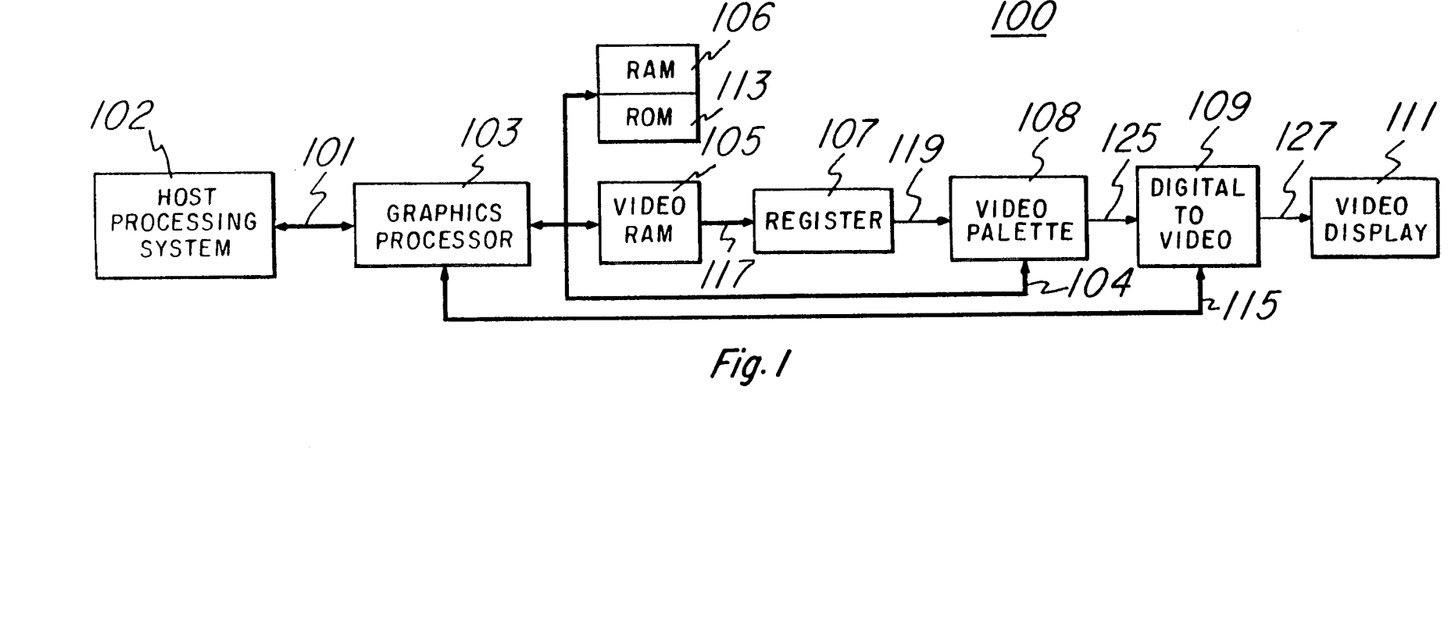
FIG. 1 is a block diagram of a data processing system.

Referring now to FIG. 1, there is shown a block diagram of a data processing system 100 including a graphics display arrangement for presenting information. A more complete description of the arrangement and operation of the system of FIG. 1 can be found in a patent application Ser. No. 821,641, filed Jan. 23, 1986, now abandoned which is incorporated herein by reference.

The data processing system 100 includes a host processing system 102, a graphics processor 103, such as a Texas Instruments TMS34010 or TMS34020 Graphics System Processor, a video random access memory 105, a data register 107, a video palette 108, a digital to video converter 109, and a video display 111.

Host processing system 102 provides the major computational capacity for the data processing system 100. Included in the host processing system 102 are a processor, an input device, a long term storage device, a read only memory, a random access memory and assorted peripheral devices that form a computer system. Arrangement and operation of the host processing system are considered to be conventional. As a result of its processing functions, the host processing system 102 determines the information content of the graphic display to be presented on a screen for the user.

Graphics processor 103 provides the major portion of data manipulation for producing the particular graphics display to be presented on the screen. The graphics processor 103 is bi-directionally coupled to the host processing system 102 by way of a host bus 101. In the arrangement of FIG. 1, graphics processor 103 operates independently from the host processing system 102. The graphics processor 103, however, is responsive to requests from the host processing system 102. Graphics processor 103 also communicates with the video random access memory 105 and the video palette 108 by way of a memory bus 104. Data to be stored in the video random access memory 105 is controlled by the graphics processor 103. The graphics processor, in turn, may be controlled either in part or wholly by a program stored in a random access memory 106 or in a read only memory 113. Read only memory 113 may store various types of graphic image data.

Additionally the graphics processor 103 controls data stored within the video palette 108 and by way of a video control bus 115 the operation of the digital to video converter 109. Through the digital to video converter, the graphics processor 103 can control the line length and the number of lines per frame of the video graphic image. Significantly, the graphics processor 103 determines and controls where graphic display information is stored in the video random access memory 105. Subsequently, during readout from the video random access memory 105, the graphics processor determines the readout sequence from the video random access memory, the addresses to be accessed, and control information required to produce the desired graphic image on the video display 111.

Video random access memory 105 stores the bit mapped graphics data which define the graphics image to be presented to the user. Control of the transfer of the data from the video random access memory 105 through the data register 107, the video palette 108, and the digital to video converter 109 to the video display 111 is provided by the graphics processor 103. Video data output from the video random access memory 105 is transferred by way of leads of a video output bus 117 to the data register 107 where it is assembled into a display bit stream. The data register 107 may be a shift register.

Storage elements of the data register 107 may be fabricated of either dynamic or static electronic circuits. Alternative choices of storage elements include any bistable electronic, magnetic, optical, or optoelectronic device with sufficient operating speed.

In accordance with a typical arrangement of the video random access memory 105, there is a bank of several separate random access memory circuits. Storage cells of the video random access memory 105 may be fabricated as either dynamic or static electronic circuits. For a single readout access operation, only one bit of data is read out from a selected storage element of each of the memory circuits. Thus a group of bits, including one bit from each of the several separate memory circuits, are read out at once. The data register 107 assembles the display bit stream for transmission by way of a lead 119 to the video palette 108. Although the foregoing describes the video random access memory 105 as an electronic circuit, the invention may also be carried out by a memory fabricated as any bistable electronic, magnetic, optical or optoelectronic device with sufficient speed.

Under control of information from the graphics processor 103, the video palette 108, such as a Texas Instruments TMS34070 Video Palette, converts the data received from the data register 107 into video level signals on a bus 125. This conversion is accomplished through a look-up table. The video level signal output from the video palette 108 may include color, saturation, and brightness information.

Digital to video converter 109 receives the digital video signals from the video palette 108 and, under control of signals received by way of the video control bus 115, converts the digital video signals into analog levels which are applied to the video display 111 via an output line 127. The number of pixels per horizontal line and the number of lines per display are determined by the graphics processor 103. Also, the synchronization, retrace, and blanking signals are controlled by the graphics processor 103. Altogether, this group of signals specify the desired video output to the video display 111.

Video display 111 produces the specified video image for viewing by the user. There are two techniques which are used widely. The first technique specifies video data in terms of color, hue, brightness, and saturation for each pixel. For the second technique, color levels of red, blue and green are specified for each pixel. The video palette 108, the digital to video converter 109, and the video display are designed and fabricated to be compatible with the selected technique.

Figure 2:
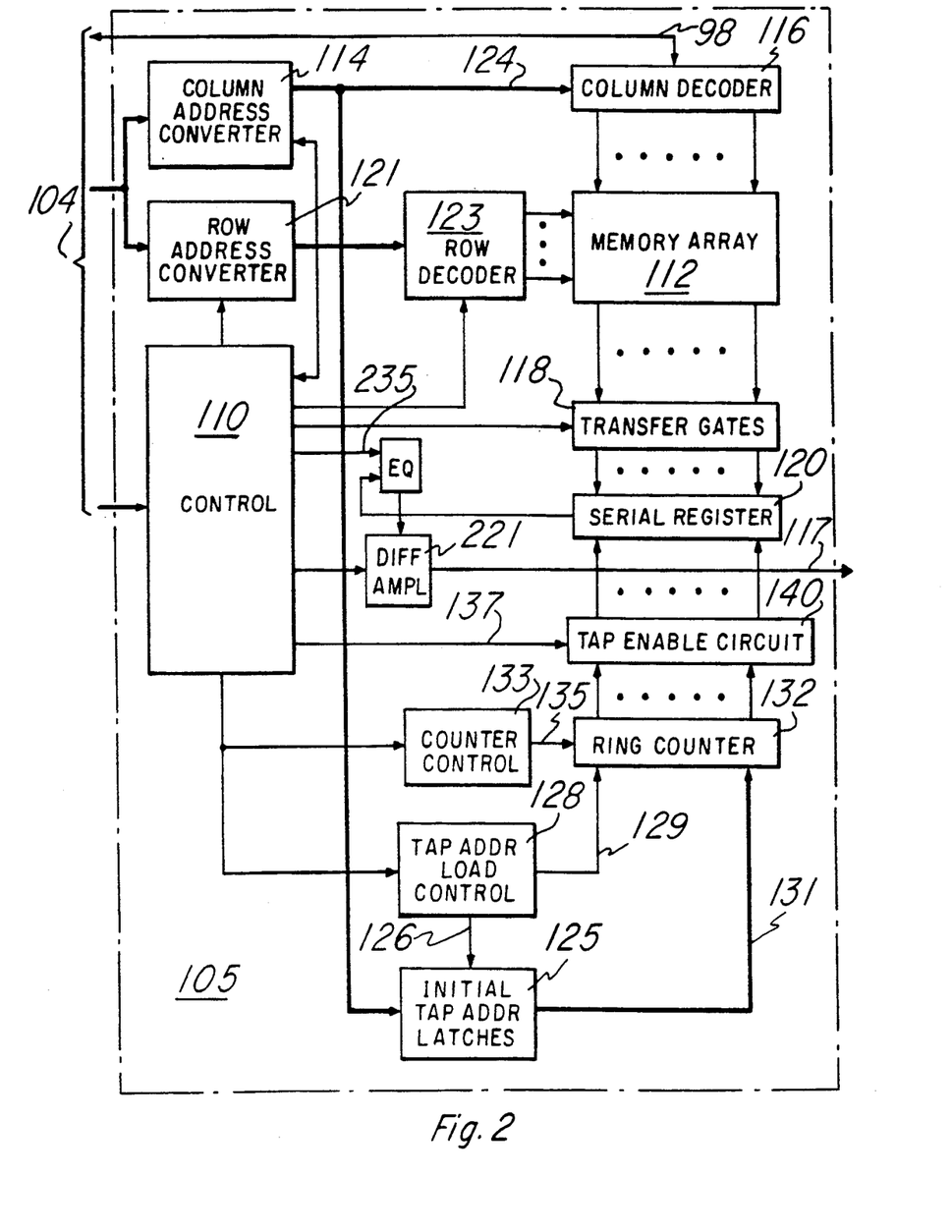
FIG. 2 is a block diagram of a video random access memory.

Referring now to FIG. 2, there is shown an arrangement of the video random access memory 105 that includes an array 112 of storage cells, addressable by row and column addresses. Row and column addresses are received by way of the bus 104 from the graphics processor 103 of FIG. 1. In response to signals also received by way of the bus 104 from the graphics processor 103 of FIG. 1, a control circuit 110 produces several signals which are used for controlling the timing and the operation of accessing the storage cells of the array 112.

A row addressing arrangement is represented by a row address converter circuit 121 and a row address decoder circuit 123. The control circuit 110 produces a signal that latches a binary address from the bus 104 into the row address converter 121 and, thereafter, produces another signal which transfers row address factors from the row address converter 121 to the row address decoder 123. The row address decoder circuit 123 decodes the row address factors to produce signals that select one row of storage cells for either random access or serial access operations.

An arrangement for selectively addressing individual columns of storage cells of the array is represented by a column address converter circuit 114 and a column address decoder circuit 116. The control circuit 110 produces a signal that latches a binary address from the bus 104 into the column address converter 114 and, thereafter, produces another signal to transfer column address factors from the column address converter 114 to the column address decoder circuit 116. The column address decoder circuit 116 produces signals that select one of the columns for random access writing data into or random access reading data out from a storage cell of the memory array 112. Such data either is received from or is transmitted to the graphics processor 103 of FIG. 1 by way of bus 104, lead 98, and the column decoder 116.

The video random access memory 105 also is arranged for serial readout of data from the memory array 112. During such a serial readout operation, a row address is applied from the graphics processor 103 of FIG. 1, through the bus 104 and the row address converter 121 to the row address decoder 123. In response to the selected row address, several bits of data from the selected row of storage cells in the memory array 112 are transferred at once through transfer gates 118 to a serial register 120. In a preferred embodiment, bits from half of a row are transferred at once to the serial register. A signal from the control circuit 110 enables the transfer gates 118. The serial register 120 includes a number of stages N equal to one-half of the number of columns in the memory array 112. During the transfer operation, a bit of data from the selected row of storage cells in the memory array 112 propagates through each of the column lines of half of the memory array and the transfer gates 118 to an associated one of the stages of the serial register 120, where the data is latched under control of a signal from the control circuit 110.

Each stage of the serial register 120 has a tap address for accessing the data from the stage. For the previously mentioned serial readout operation, a sequence of data bits can be read out from a section of serial register stages commencing with any desired serial register initial tap address, which corresponds to a column address for the memory array 112. Such a serial register initial tap address is applied from the graphics processor 103 of FIG. 1, through a plurality of leads of the bus 104 to the input of the column address converter 114, just as a column address is applied for a random access operation to the memory array 112. The column address converter 114 converts the several bits of the input binary address into one or more code words representing the input binary address. Such a conversion operation is to be discussed in detail subsequently with respect to the description of FIG. 4. The resulting digital code may be in the form of a code word called a factor.

For illustrating the serial readout operation of video random access memory 105, assume that one code word is produced by the column address converter 114. That code word is forwarded over a bus 124 and is latched into an initial tap address latches circuit 125. Control signals from the control circuit 110 determine the timing and operation of serial access from the serial register 120. Initially signals from the control circuit 110 reset the counter control circuit 133 and the tap address load control circuit 128. Thereafter, the code word on the bus 124 is latched into the circuit 125 in response to a signal LATCH applied over lead 126 from the tap address load control circuit 128. Subsequently, in response to a signal LOAD on a lead 129 from the tap address load control 128, the code word previously latched into the initial tap address latches 125 is loaded through a bus 131 into a ring counter 132. Clock signals from the control circuit 110 are gated by the counter control circuit 133 to produce serial clock signals on a lead 135 for shifting data through the stages of the ring counter 132.

A signal on a lead 137 from the control circuit 110 enables a tap enable circuit 140 to apply the state of the ring counter 132, representing a tap address, for accessing a stage of the serial register 120. The signal on the lead 137 is a pulse which enables the circuit 140 only long enough for the state of the ring counter 132 to access the selected tap of the serial register 120. Data accessed from a series of stages of the serial register 120 is transmitted in a serial sequence by way of equalized data lines, a differential amplifier 221 to and through a lead of the bus 117 to the register 107 of FIG. 1.

Figure 3:
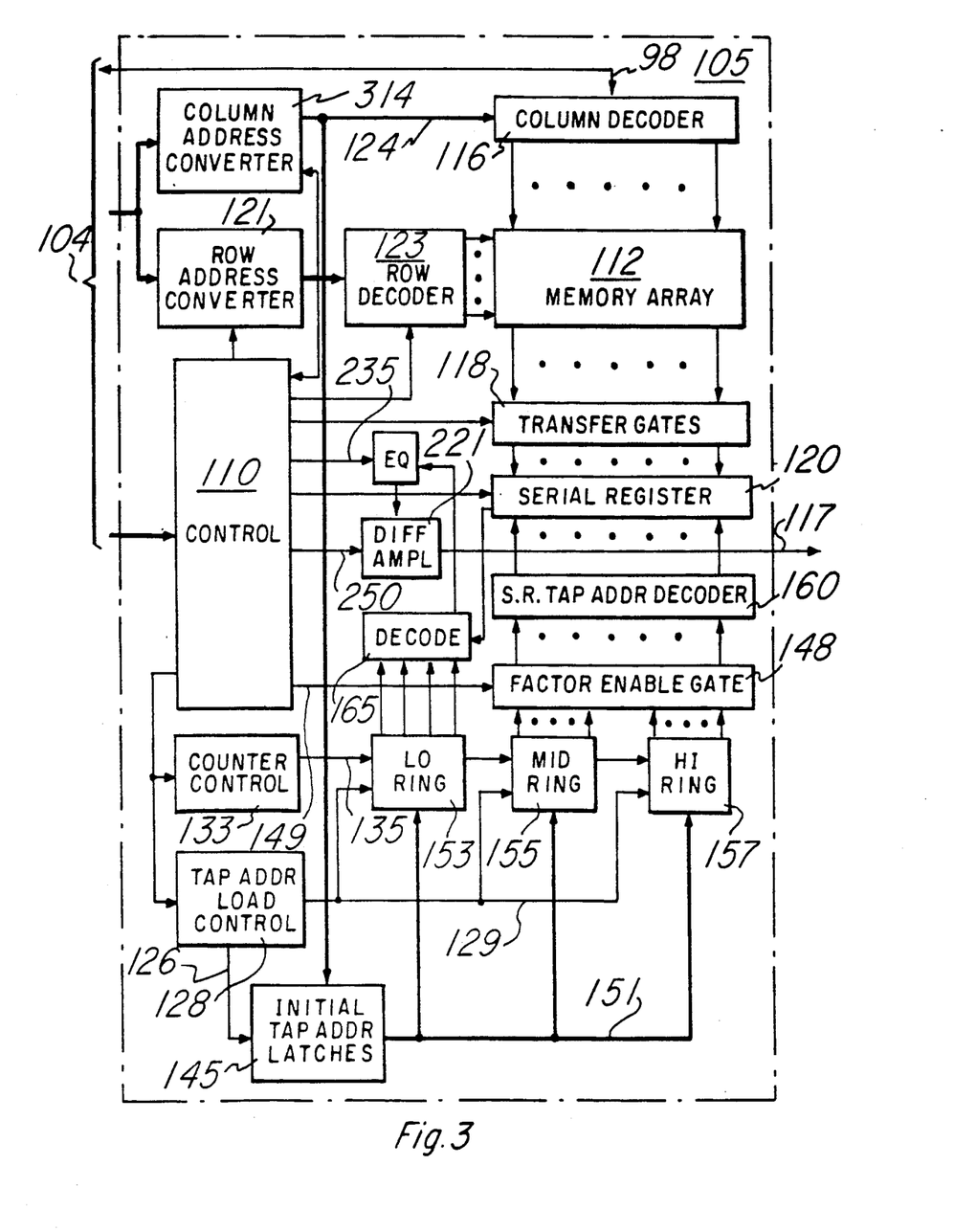
FIG. 3 is a block diagram of an alternative video random access memory.

Referring now to FIG. 3, there is shown an alternative arrangement of the video random access memory 105. In FIG. 3, most of the arrangement is like the arrangement of FIG. 2, and, therefore, the same numerical designators are used to identify like features. Although a single code word, or factor, may be used to represent the initial tap address on the bus 124 of FIG. 2, it is preferable to use plural code words, or factors, on the bus 124 to represent the initial tap address. Thus, a three part column address converter 314 is used to convert the received binary column address into three factors.

Initial tap address latches 145 include a separate latching circuit for each of the factors. A bus 151 includes sufficient leads to apply each of the separate factors to a separate ring counter circuit. Each factor includes one active signal out of some larger number of signals, e.g. one-out-of-M, where M may have different values.

In the example of FIG. 3, there are three factors. A first one of the factors represents the two least significant bits of the initial tap address received by way of the bus 104. This first factor is referred to hereinafter as a low part, or low factor. Second and third factors represent, respectively, the middle three bits and the three most significant bits of the initial tap address. The middle part and the most significant part are referred to hereinafter as the middle part, or middle factor, and the high part, or high factor.

Each of the three factors is latched into a separate one of three ring counters 153, 155, 157. The low factor is latched into the ring counter 153, the middle factor is latched into the ring counter 155, and the high factor is latched into the ring counter 157 by the signal LOAD on the lead 129. Control of the ring counters 153, 155 and 157, in response to the serial clock signal on the lead 135, is to be discussed in detail subsequently with respect to the description of FIGS. 5, 6, 7 and 8.

The middle and high factors of the serial register initial tap address and the subsequently produced sequential addresses are gated by way of code word gates 148 and are applied as pulses to a serial register tap address decoder 160, where the middle and high factors are decoded into a one-out-of-N/4 code for selecting a group of serial register tap addresses at once. A control pulse from the control circuit 110 is applied by way of the lead 149 to the gates to enable the states of the ring counters 155 and 157 to pass through to the tap address decoder 160, as will be discussed in detail subsequently with respect to the description of FIGS. 5, 6, 7 and 8. The signal on the lead 149 enables the gates 148 only long enough for the states of the ring counters 155 and 157 to access the selected tap of the serial register 120.

When a group of serial register tap addresses is addressed by the one out-of N/4 code from the serial register tap address decoder 160, four bits of data are read out of the serial register 120 to a final decoder stage 165 on separate leads. The final decoder stage 165 is arranged as a multiplexer that transmits one of the four bits at a time depending upon the address factors applied to the low part ring counter 153. In response to subsequent sequential serial register tap addresses applied from the serial register tap address decoder 160 and the final decoder stage 165, a serial sequence of data bits is transmitted out of the video random access memory 105 by way of the equalized data lines, a differential amplifier 221, and the output lead of the bus 117 to the data register 107 of FIG. 1.

Figure 4:
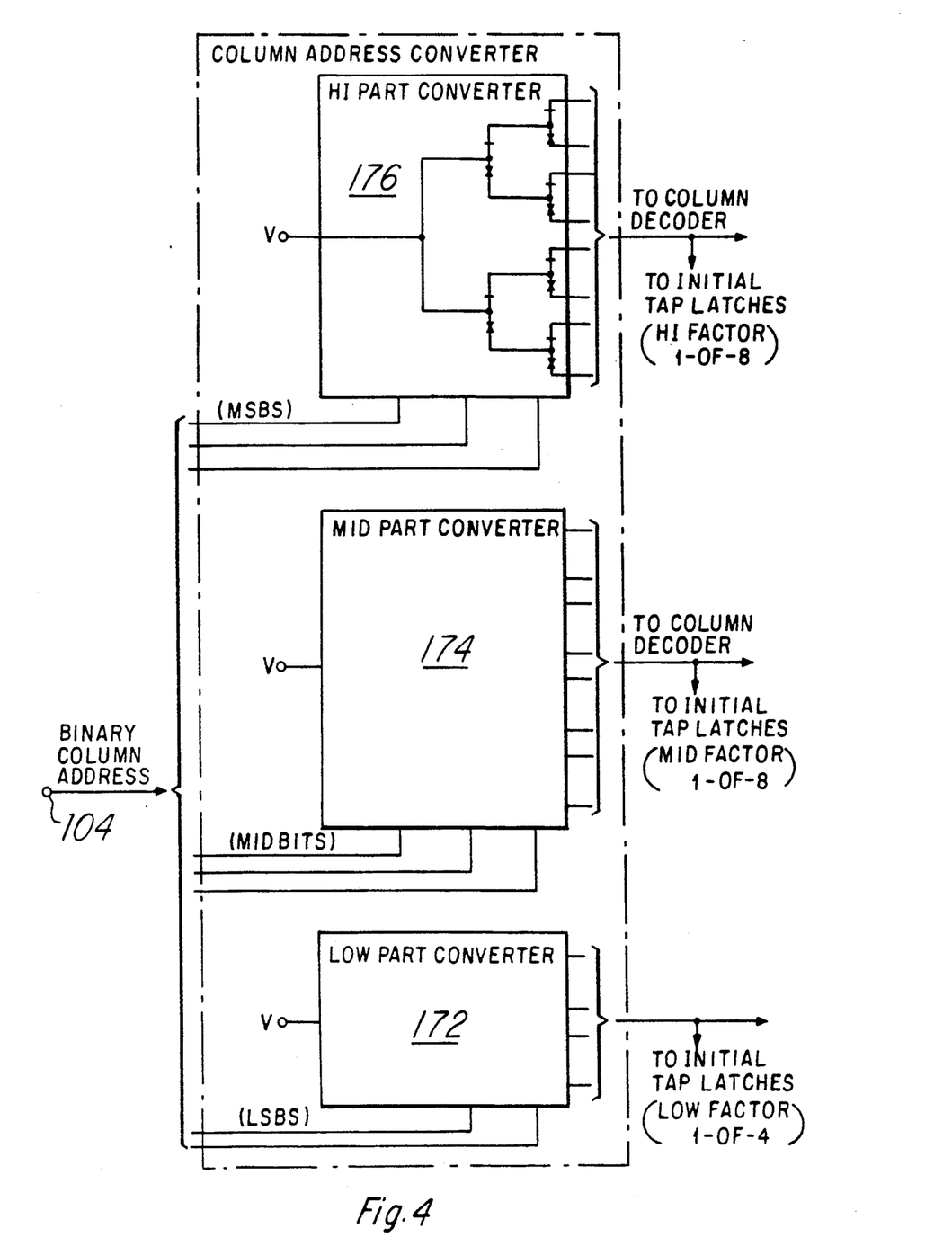
FIG. 4 is a block diagram of a column address converter.
Figure 5:
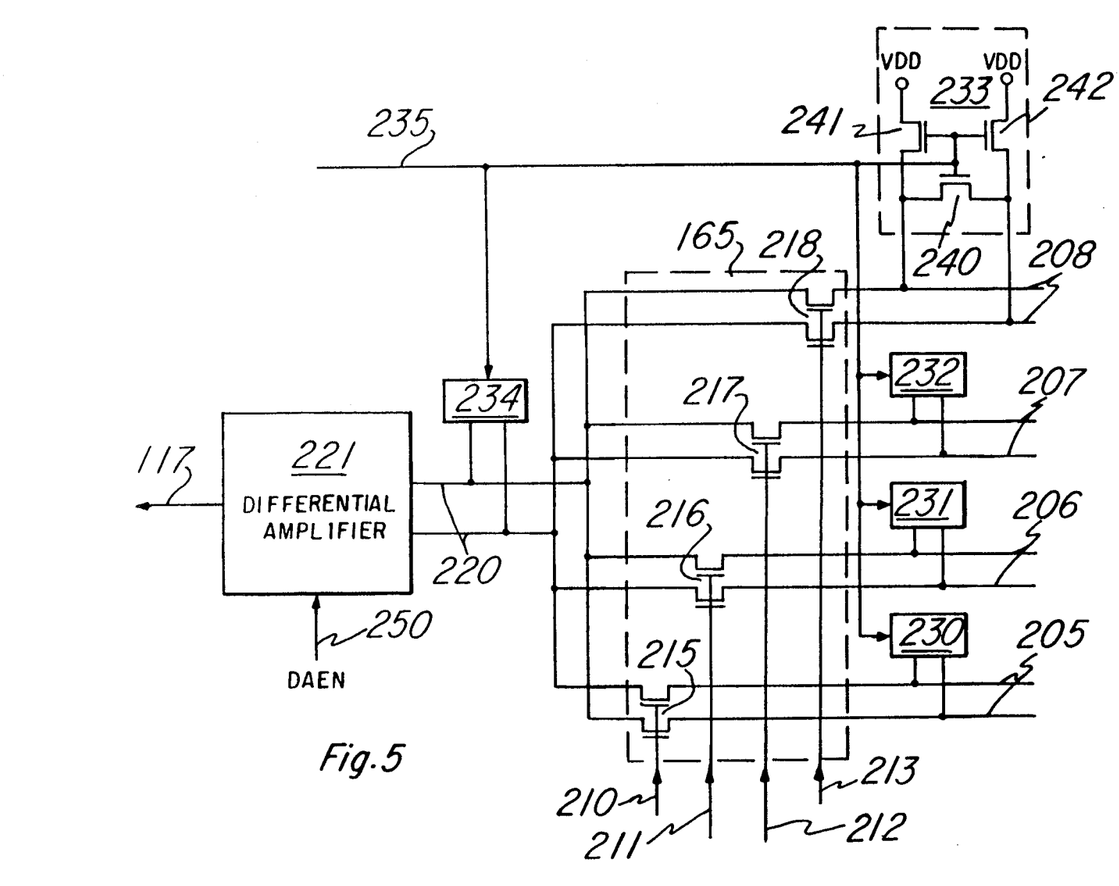
FIGS. 5, 6, 7 and 8, when positioned as shown in FIG. 9, present a block and logic diagram of a ring counter and decoder arrangement for generating a sequence of one-out-of-N tap addresses for the serial register by way of pulsed decoding.

Referring now to FIG. 4, there is shown a detailed logic diagram of the column address converter 314 of FIG. 3. For purposes of illustration, it is assumed that the applied binary address includes eight bits. At the input to the column address converter 314, the applied binary address is separated into three parts. The two least significant bits (LSB's) are applied to control terminals of a low part converter 172, the three middle bits are applied to control terminals of a middle part converter 174, and the three most significant bits (MSB's) are applied to a high part converter 176. The low, middle and high part converters 172, 174 and 176 are similar logic tree circuits that convert the input binary code into three separate words, or factors, in a one-out-of-M code. The numeral M may have a different value in different factors. Because the logic arrangements of the circuits 174 and 176 are similar, details are shown only for the high part converter 176. The low part converter 172 is a two level tree rather than the three-level tree, shown for the high part converter 176.

In FIG. 4, the conduction path through the logic tree of the high part converter 176 is controlled by the most significant three bits of the applied binary address. When the selection of branches of the tree is completed, a voltage V, applied to the trunk of the tree, is conducted to one-out-of-eight output leads. The other seven output leads remain at a low level. Although FIG. 4 shows the tree branches with switch contacts, it is obvious that logic gate equivalents may be substituted directly.

Since the binary address information is applied simultaneously to the low, the middle and the high parts of the column address converter 314, the low, middle and high factors of the converted column address, or serial register initial tap address, are produced simultaneously. For serial readout operations, the low, middle and high factors of the column address are applied at once to the low part, the middle part, and the high part serial register tap address ring counters 153, 155 and 157 of FIG. 3. As previously mentioned, those ring counters are settable and, accordingly, are set by the low, the middle and the high factors of the serial register initial tap address.

Figure 8:
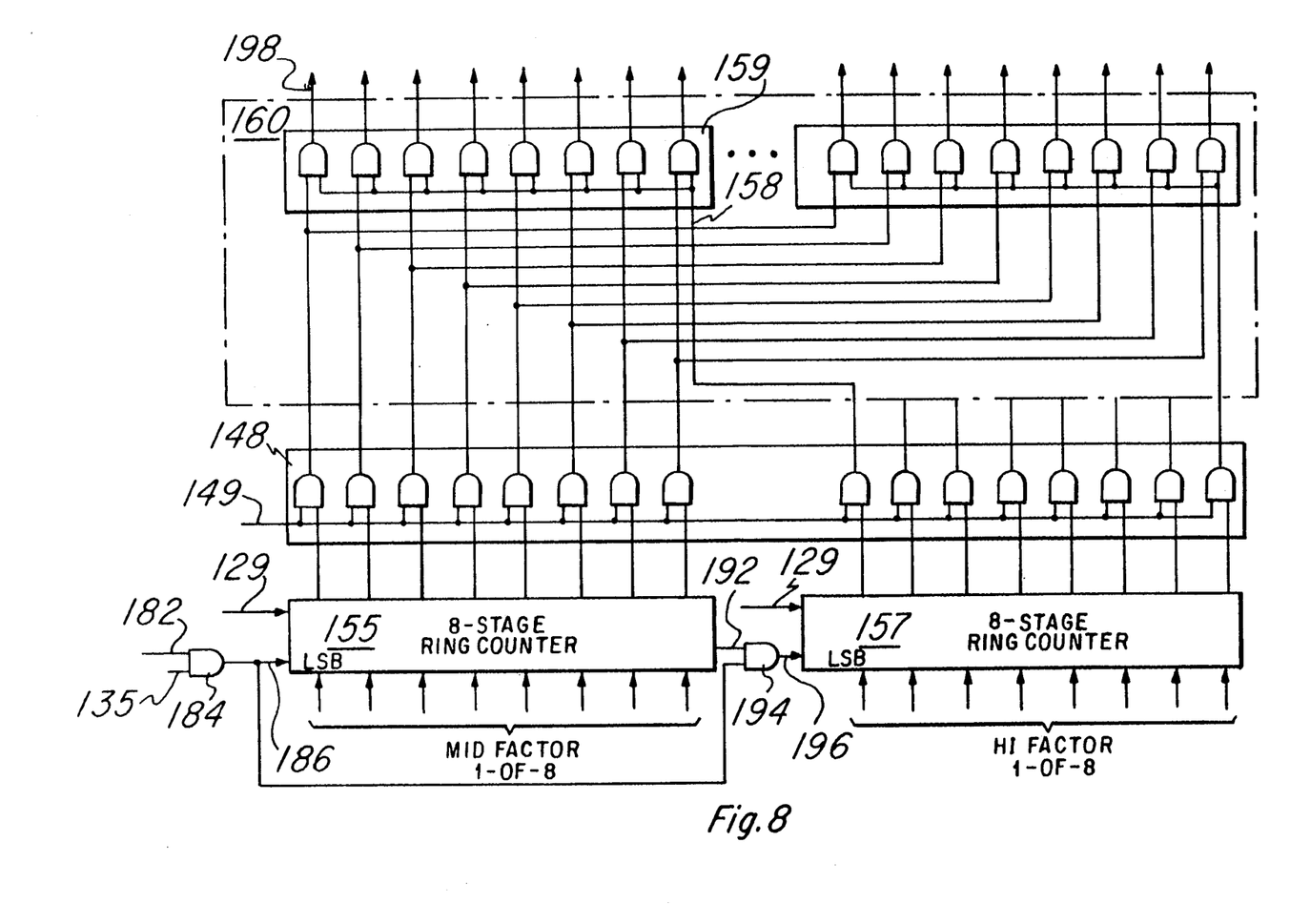
Figure 9:
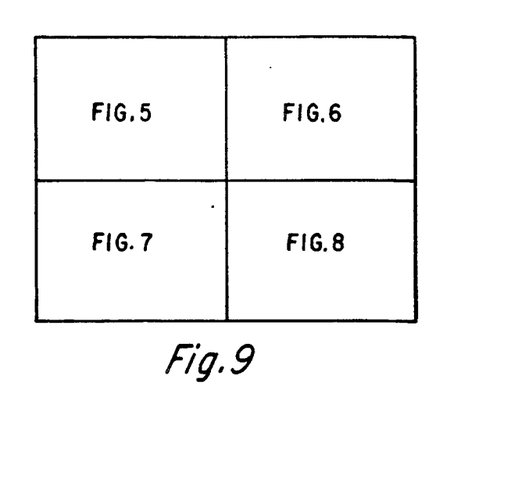

Referring now to FIGS. 5, 6, 7 and 8 (which should be positioned as shown in FIG. 9), there is shown a detailed logic block diagram of the low, the middle and the high ring counters 153, 155 and 157, of a factor enabling gate circuit 148, and of the serial register tap address decoder 160 of FIG. 3.

For both the middle and the high factors of the serial register initial tap address, the one out-of-eight bit code words are latched, respectively, into the middle and the high part eight-stage ring counters 155 and 157, in response to a control signal LOAD on the lead 129. For the low factor of the serial register initial tap address, the one-out-of-four code word is latched into the low part four-stage ring counter 153, in response to the control signal LOAD on the lead 129. In each ring counter 153, 155 and 157, one stage stores a high signal and the other stages store low signals. The position of the single high signal in each ring counter is shifted from stage to stage along the respective low part, middle part, and high part ring counters 153, 155 and 157 according to a specific logic scheme, in response to serial clock signals applied by way of the lead 135. Each serial clock pulse, applied on the lead 135, shifts all of the bits stored in the low part serial register tap address ring counter 153, one stage from left to right, i.e., from the least significant bit position on the left to the most significant bit position on the right.

An output signal is taken from the most significant bit position stage at the right hand end of the ring counter 153 and is applied through a lead 182 to one input of a control AND gate 184. The serial clock signal on the lead 135 is applied to a second input of the AND gate 184, which produces a high output signal only when the serial clock signal is high while the single one bit resides in the most significant bit position stage of the ring counter 153. Such an event produces a first counter clock signal on a lead 186 for shifting the contents of the stages of the ring counter 155 one stage from left to right, i.e., from the least significant bit position at the left toward the most significant bit position at the right.

Similarly an output signal is taken from the most significant bit position stage at the right hand end of the ring counter 155. That output signal, on lead 192, is applied together with the first counter clock signal as inputs to an AND gate 194. The resulting second counter clock signal produced on a lead 196 shifts the contents of the stages of the ring counter 157 one stage from left to right for each cycle. A high second counter clock signal occurs only when the first counter clock signal is high while the single one bit resides in the most significant bit position stage of the ring counter 155.

It is noted that the contents of all of the ring counter stages of each separate ring counter are shifted all at once. In response to each applicable clock signal, there is no delay caused by waiting for possible carry signals from less significant bit positions. Accordingly, the generation of a sequence of tap addresses is produced faster with fewer circuits than a sequence of tap addresses could be generated heretofore by the prior art arrangement including a binary counter which must wait for possible carry propagations.

Constantly, the contents of the eight stages of both the middle and high part ring counters 155 and 157 are applied to the input of the plurality of code word gates 148. Each of the code word gates is an AND gate. One input to each AND gate is a separate one of the output leads from the two ring counters 155 and 157. The other input to each of the AND gates is a factor enable pulse FEP that is applied by way of a lead 149 from the control circuit 110.

The factor enable pulse on the lead 149 is activated only at times that the address factors need to be applied to the serial register tap address decoder to access a selected stage of the serial register. When the address factors are needed for an access operation, they are applied through the activated code word gates 148 to the input of the serial register tap address decoder 160 for producing a part of the desired tap address. As the contents of the ring counters 155 and 157 shift, from stage to stage, new group tap addresses are produced by the tap address decoder 160 in a sequence of addresses represented by the one out of-N/4 code. Under control of the factor enable pulse FEP, each address is applied only long enough to assure an accurate access. In the tap address decoder 160, there are sixty four AND gates. Only a part of those sixty four AND gates are shown in FIG. 8 to simplify the drawing while disclosing enough of the logic arrangement to establish a pattern which can be readily completed by any person skilled in the art.

In the tap address decoder 160, the AND gates are divided into groups of eight gates. All of the gates from each group receive one of their inputs from the contents of the same stage of the high part ring counter 157. For example, the contents of the least significant bit stage of the high part shift register 157 are applied through a lead 158 in multiple to one input of each of a group of eight AND gates 159. The other input of each of the AND gates 159 is the contents of a different one of the stages of the middle part ring counter 155.

When all of the AND gates of the serial register tap address decoder 160 are properly connected and the factor enable pulse FEP is activated, that decoder 160 generates the one-out-of-N/4 code for selecting the desired group of stages of the serial register 120 for reading out the bits of data.

Figure 6:
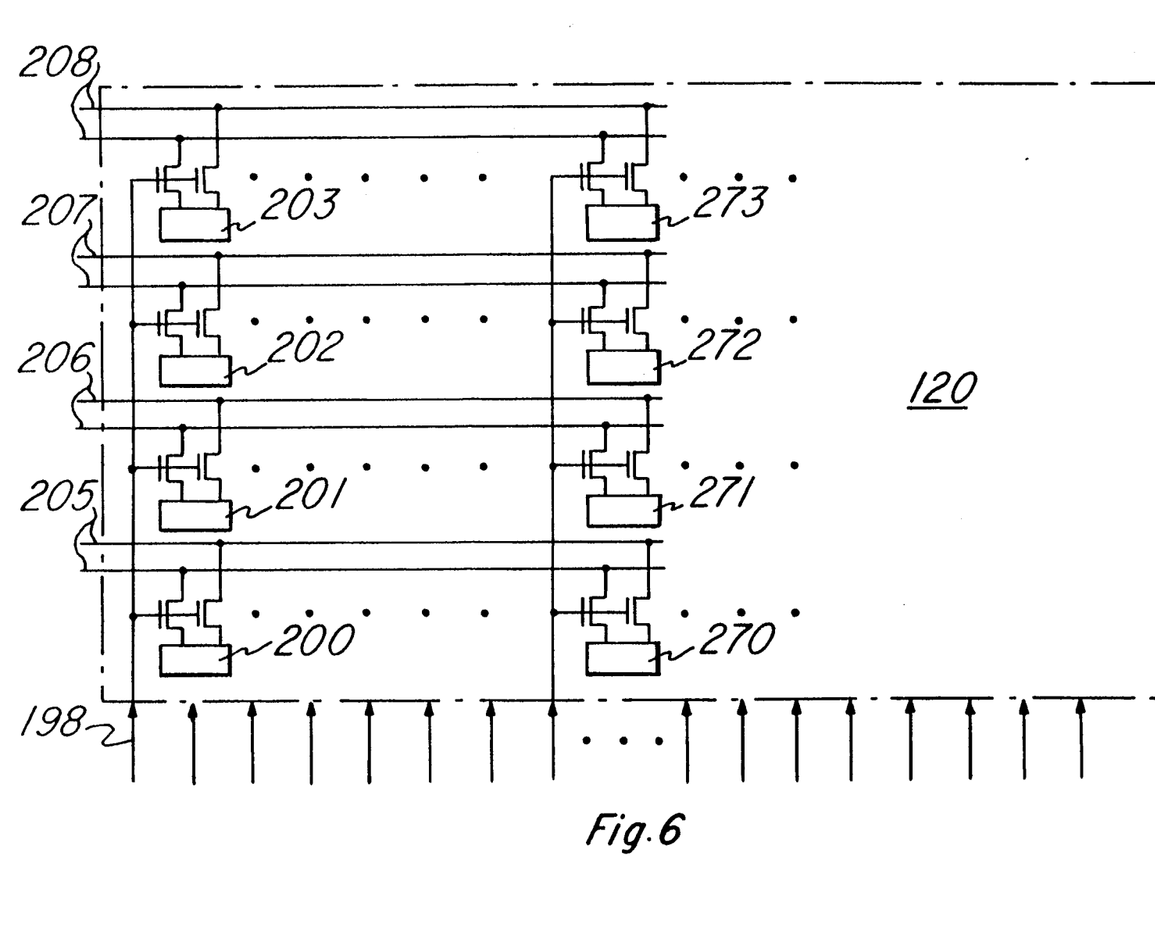
Figure 7:
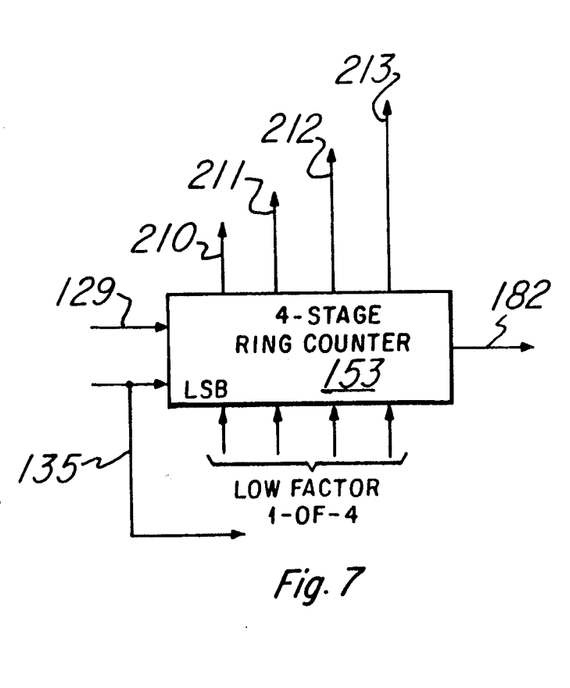

Included in FIG. 6 is a partial logic schematic of the serial register 120. There is a group of four serial register stages associated with each stages selection lead from the serial register tap address decoder 160. For example, the stages selection lead 198 is associated with serial register stages 200, 201, 202, 203, the four least significant bit positions of the serial register 120. Those stages are arranged to store data supplied to them from the memory array in a well-known transfer operation by way of circuitry that is not shown to simplify the drawing. Gate devices interposed between the stages selection lead 198 and the serial register stages 200, 201, 202 and 203 operate in response to the presence or absence of a high signal on the stages selection lead 198 for enabling the data in each stage to be applied to the associated pairs of data lines 205, 206, 207 and 208, respectively. The four bits of data are applied simultaneously to the four pairs of data lines 205, 206, 207 and 208. Only one of the bits is to be used for the readout, as selected by one of the connected transmission gates to be described subsequently. The three serial register stages not selected for the readout still must drive their associated data lines. Driving the three data lines, from which the data bit is not to be transmitted, results in a waste of power. The aforementioned pulsed enabling of the address factors limits the waste of power.

While the group of four data bits is applied to the pairs of data lines 205, 206, 207, and 208, the output of the low part ring counter 153 controls the operation of the final decoder stage 165. Since the output of the low part ring counter 153 is a one out of four code, there is an enabling high signal applied to each one of the leads 210, 211, 212 and 213 in sequential order.

As previously mentioned, sequentially produced tap addresses represent a serial sequence of tap addresses for reading out a serial sequence of data from the serial register stages associated with the memory array 112 of FIG. 2. Consequently, pairs of transmission gates 215, 216, 217 and 218 are enabled one at a time in sequential order to output data bits onto the pair of leads 220. The sequence wraps around from the most significant bit position to the least significant bit position. Each data bit occurring on the pair of leads 220 is applied to a differential amplifier 221 from which it is output on a lead of the output bus 117.

Before the data bits are applied from the accessed serial register stages 200, 201, 202 and 203 to the pairs of data lines 205, 206, 207 and 208, those data lines are brought to equal potentials by equalizer circuits 230, 231, 232, 233 and 234. All of those equalizer circuits are alike. Therefore only the equalizer circuit 233 is shown in detail.

Figure 10:
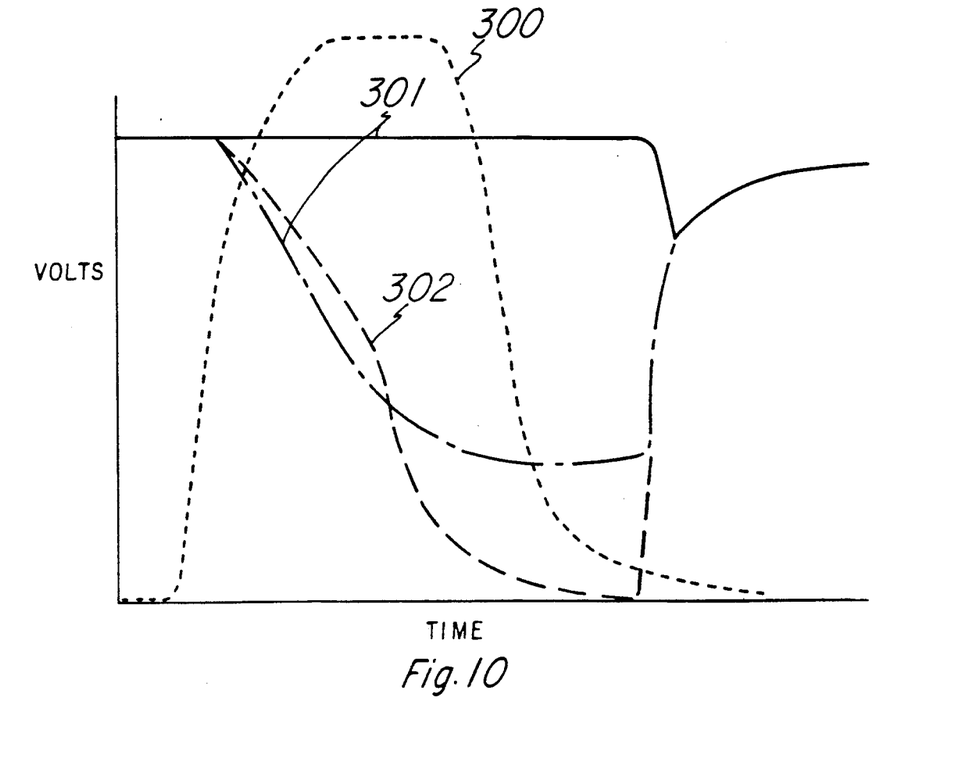
FIG. 10 is a timing diagram for the operation of data access and equalization.
Figure 11:
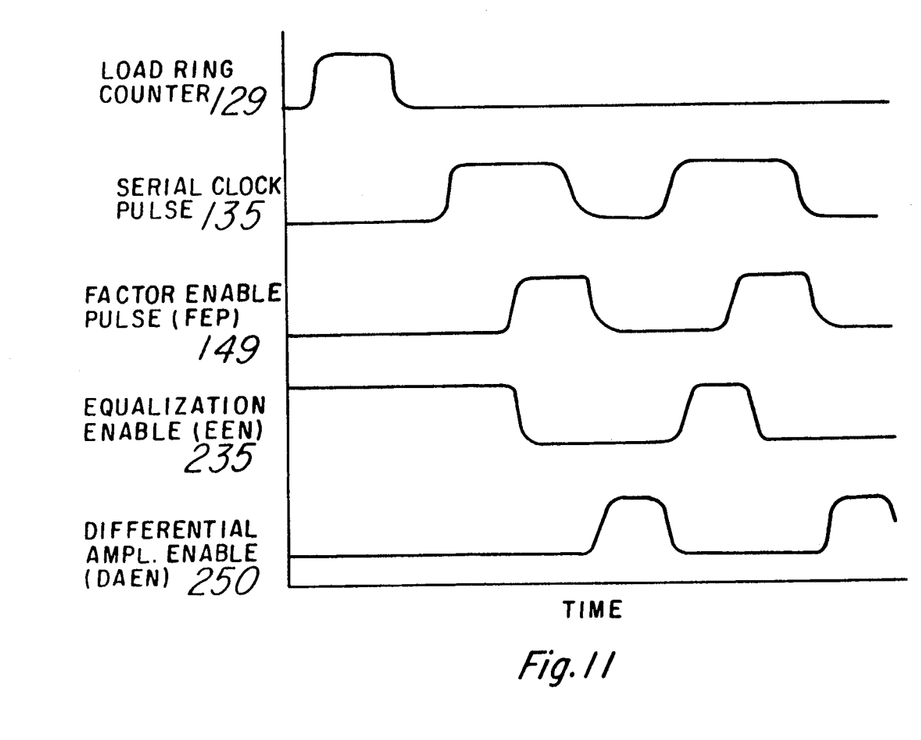
FIG. 11 is a timing diagram for accessing data from the serial register.

An equalize enable signal EEN is activated on a lead 235 to turn on transistors 240, 241 and 242 to equalize the potentials on all of the pairs of the data lines 205, 206, 207 and 208, as shown in FIG. 10.

In FIG. 10, the signal levels on the data lines are shown commencing at a high level. When the pulsed select stages signal 300 on the stages selection lead 198 is activated, the signals 301 on the data lines diverge. The signal 302 on the selected pair of data lines 208 diverges at a slower rate because it is loaded more by the enabled transmission gates 218. When the differential amplifier 221 turns on in response to a control signal DAEN on a lead 250, the rate of divergence of the signals 302 on the pair of data lines 208 increases to drive one side of the pair to zero volts. Once the pulsed select stages signal on the stages selection lead 198 is turned off, the transistors 240, 241 and 242 in the equalizer circuit 233 rapidly pull the divergent signals on the data lines 205, 206, 207 and 208 back to an equal potential.

The arrangements of FIGS. 3, 4, 5, 6, 7 and 8 show in detail the logic used for address conversion and address decoding in an exemplary embodiment that uses three factor addressing. The factor addressing scheme is selected to efficiently decode the applied binary address. Other binary address decoding schemes may alter the number of converters and ring counters and the lengths of the ring counters so that the schemes can efficiently perform binary address decoding. The arrangement of FIG. 2, on the other hand, is laid out so that all tap address decoding is accomplished by the ring counter 132 and tap enable circuit 140. Such an arrangement does not use a separate final decoder stage 165, as shown in FIGS. 3, 5, 6, 7 and 8.

Although specific lengths of code words have been used for exemplary purposes, other lengths of code words and commensurate circuitry arrangements can be readily scaled up or down to accommodate any specific application.

Because of the transfer gate 118 arrangement of FIGS. 2 and 3, the memory array 112 is isolated from the serial register 120 as soon as a row of data is transferred from the memory array 112 into the serial register 120. Thus, random access read or write operations can be carried out within the memory array 112 while a serial readout operation is carried out from the serial register 120.

The foregoing describes one or more embodiments of the invention. Such embodiments together with others, made obvious in view thereof, are considered to be within the scope of the appended claims.

What is claimed is:

1. A dual-port memory, arranged for random and serial access, the memory comprising:

a serial register having pairs of complementary data lines, each pair of data lines being gated separately to a plurality of serial register states;

a group of data gates, collectively responsive to a stages select signal, each data gate of the group being arranged for enabling connection of one serial register stage to a different one of the pairs of data lines, at once;

a decoder, responsive to a code word on plural input leads, for generating the stages select signal being applied to the data gates; and a plurality of code word gates, each code word gate being interposed in one of the input leads and responsive to a control pulse, for enabling the stages select signal only while the control pulse is active.

2. A dual-port memory, in accordance with claim 1, further comprising:

a plurality of equalizer circuits, each connected with one of the data line pairs, for equalizing potential levels on the data line when the connected equalizer circuit is enabled, and a lead for applying an enabling signal to the plurality of equalizer circuits.

3. A dual-port memory, in accordance with claim 2, further comprising:

a final decoder stage, connected with the pairs of data lines and responsive to a selection code, for accessing a single data signal from one of the pairs of data lines.

4. A dual-port memory, in accordance with claim 3, further comprising:

a differential amplifier circuit connected with the pairs of data lines, and a lead for applying a signal to activate the differential amplifier circuit and thereby increase the rate of divergence of the accessed single data signal from the one pair of data lines.

5. A dual-port memory, in accordance with claim 2, further comprising:

a differential amplifier circuit connected with the pairs of data lines, and a lead for applying a differential amplifier enabling signal to the differential amplifier circuit.

6. A dual-port memory, in accordance with claim 2, wherein data signals, applied to the pairs of complementary data lines, reside on the pairs of complementary data lines only in response to the control pulse.

7. A dual-port memory, in accordance with claim 1, wherein data signals, applied to the pairs of complementary data lines, reside on the pairs of complementary data lines only in response to the control pulse.

* * * * *